TRANSISTOR SWITCH

Filed March 18, 1964

INVENTOR.
JAMES JURSIK
BY Elmer Galbiati
ATTORNEY

United States Patent Office 3,275,852

Patented Sept. 27, 1966

3,275,852

TRANSISTOR SWITCH

James Jursik, Rochester, Minn., assignor to International Business Machines Corporation, New York, N.Y., a corporation of New York Filed Mar. 18, 1964, Ser. No. 352,837
9 Claims. (Cl. 307—88.5)

This application relates to electronic circuitry and, more particularly, to transistor circuits.

In many applications where analog current or voltage signals are passed through switching networks such as in process control systems it is essential that a high degree of signal integrity be maintained. The accuracy of such systems is directly affected by any degradation in the signal which occurs in the switching circuitry.

An ideal switch presents zero impedance across its terminals when the switch is closed and an infinite impedance across its terminals when the switch is open. Mechanical switches which approach these ideal characteristics are available; however, mechanical switches cannot be used in many systems due to speed and reliability considerations. Transistors are not ideal switches because when a transistor is ON or conducting, offset potential and saturation resistance exist, and when the transistor is in the OFF condition leakage current flows.

It is known that by operating certain transistors in the inverted mode both the offset potential and the leakage current can be reduced. Furthermore, if two transistors are operated in the inverted mode in a back-to-back arrangement, further reduction in offset potential can be obtained due to the cancelling effect of the series junctions. An example of such a circuit is shown in an article entitled "Junction Transistors as Switches" by R. L. Bright, Transactions of the AIEE, March 1955, pages 55–156. One disadvantage of the switch shown in the above referenced article is that the maximum voltage that the switch can sustain is limited by the maximum allowable reverse voltage of the base-emitter junction of the transistors. For most transistors this is relatively low and it imposes a severe limitation on the use of such switches in certain applications.

An object of the present invention is to provide an improved transistor switch.

A further object of the present invention is to provide an improved transistor switch which has a low offset potential.

Yet another object of the present invention is to provide an improved transistor switch which has a low offset potential and which can switch relatively high voltages.

The transistor switch of the present invention includes two transistors connected back-to-back in the inverted mode with a common collector connection, a common base connection and a control connection for applying a voltage between the common base connection and the common collector connection. It also includes at least one unidirectional device in the common base connection and means for open circuiting the control connection.

The foregoing and other objects, features and advantages of the invention will be apparent from the following more particular description of preferred embodiments of the invention, as illustrated in the accompanying drawings.

Figure 1:
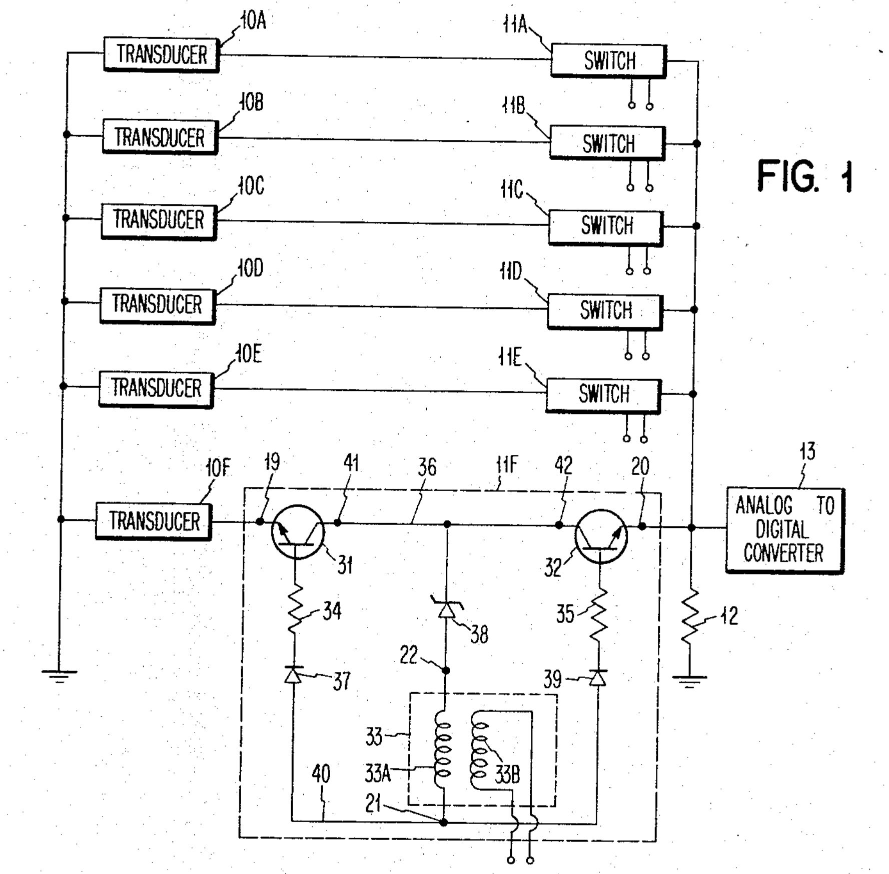
FIGURE 1 shows a first preferred embodiment of the present invention.

FIGURE 1 shows a data gathering network for a process control system. The network includes six transducers 10A to 10F which generate analog signals, a plurality of identical switches 11A to 11F, a load resistor 12, and an analog to digital converter 13. Only switch

11F is shown in detail. The other switches 11A to 11E are identical to switch 11F.

Switches 11 are selectively closed one at a time, whereby the analog signals from transducers 10 are selectively transferred to the analog to digital converter 13. The analog to digital converter 13 converts the analog signals to digital form for further processing by a digital computer. In order to insure that the output of the analog to digital converter 13 is accurate, it is essential that there be a minimum amount of voltage drop across switches 11. Furthermore, it is essential that when any switch is in the open position it can sustain a relatively high voltage from the associated transducer 10 without breaking down.

Switching circuit 11F includes two NPN transistors 31 and 32, two diodes 37 and 39, a zener diode 38, two resistors 34 and 35, and a control circuit 33. The collectors of transistors 31 aand 32 are connected together by line 36 and the bases of transistors 31 and 32 are connected together through resistors 34 and 35 and through diodes 37 and 39 by line 40. The control circuit 33 is connected in series with zener diode 38 between lines 36 and 40.

In order to close switch 11F; that is, in order to close the circuit between points 19 and 20, control circuit 33 generates a voltage which is positive at point 21 and negative at point 22. The magnitude of the control voltage used to close the switch must be sufficient to both overcome the breakdown voltage of zener diode 38 and to forward bias the base-collector junction of transistors 31 and 32. Due to the forward bias on the base-collector junction, current flows from the base to the collector of each of the transistors and as will be seen when current flows from the bases to collectors of the transistors, the switch is closed.

When current flows from the base to the collector of a transistor a certain potential exists between the collector and the emitter of the transistor. This potential is generally termed the offset potential. Since transistor 31 and the circuitry associated therewith is substantially identical to transistor 32 and the circuitry associated therewith, the offset potential of transistor 31 is substantially identical to the offset potential of transistor 32. Hence, if transducer 10F varies the potential of point 19, the potential of point 20 will vary by a like amount. The reason for this can be seen if a circuit is traced from the emitter to the collector of transistor 31 through line 36, and from the collector to the emitter of transistor 32. Two potentials are encountered along the above path. The first potential encountered is the offset potential of transistor 31 and the second potential encountered is the offset potential of transistor 33. For the NPN transistors shown in FIGURE 1 and with the collector-base junctions forward biased the polarity of the offset potentials will be such that the emitter of transistor 31 (point 19) will be positive with respect to the collector of transistor 31 (point 41) and the emitter of transistor 32 (point 20) will be positive with respect to the collector of transistor 32 (point 42). Hence, the two offset potentials are series opposing along the above path and since the two offset potentials are substantially equal they cancel each other. Thus, when switch 11F is closed the potential of point 19 is substantially identical to the potential of point 20.

In general, switch 11F is open whenever circuit 33 does not generate a voltage, as indicated above. When switch 11F is open and transducer 10F generates a voltage at point 19, either the emitter-base junction of transistor 31 or the emitter-base junction of transistor 32 is reverse biased. The particular junction which is reverse biased depends upon the polarity of the voltage generated by transducer 10F. If transducer 10F generates a positive voltage at point 19, the emitter-base junction of transistor 31 is reverse biased and if transducer 10F generates a negative voltage at point 19, the emitter-base junction of transistor 32 is reverse biased. Thus, when switch 11F is open, voltage changes at point 19 do not affect point 20.

If diodes 37, 38 and 39 were not included in the circuit, the amount of voltage which the circuit could sustain in the open condition would be governed by the emitter-base breakdown voltage of transistors 31 and 32. Normally, the emitter-base breakdown voltage of a transistor is relatively low; hence, the switch could sustain a relatively small amount of back voltage. Without diodes 37, 38 and 39 in the circuit if a positive voltage is applied to point 19 which exceeds the emittter-base breakdown voltage of transistor 31, current could flow from point 19 to point 20 along two paths. First, it could flow out of the base circuit of transistor 31 through line 40 into the base of transistor 32 and out of the emitter of transistor 32. Second, a positive voltage applied to the emitter of transistor 31 which breaks down the base-emitter junction, of necessity forward biases the base-collector junction of transistor 31; hence, current can flow into the emitter of transistor 31 and out of the collector of transistor 31 through control circuit 33 into the base of transistor 32 and out of the collector of transistor 32. For a negative voltage applied at point 19 the situation is exactly the same as outlined above, except that the role of transistors 31 and 32 is reversed.

With diodes 37, 38 and 39 in the circuit, the two paths indicated above are blocked. The first path, i.e., through the base, is blocked by diodes 37 and 39, and the second path, i.e., through the collector, is blocked by the zener voltage of zener diode 38. With the present invention the amount of back voltage which the switch can sustain is normally limited to the sum of the breakdown voltage of the emitter-base junction of one of the transistors and the zener voltage of diode 38. If, however, the above sum exceeds the sum of the emitter-base breakdown voltage of one transistor plus the collector-base breakdown of the other transistor, then the amount of back voltage which the switch can sustain is the sum of the emitter-base breakdown voltage of one transistor plus the collector-base breakdown voltage of the other transistor. The present invention thereby generally increases the maximum allowable back voltage by an amount equal to the zener voltage of transistor 38.

As shown herein control circuit 33 merely consists of a transformer having two coils 33A and 33B. A pulse of correct polarity and sufficient magnitude applied to coil 33B generates a pulse in coil 33A which closes the switch for the duration of the pulse in coil 33A. The switch 11F is normally open and it is only closed when a pulse is applied to the control signal input.

An essential requirement for the operation of the switch of the present invention is that when the switch is in the open or OFF condition the circuit connected between the common collector connection and the common base connection must be open circuited with respect to current flowing from the common collector connection to the common base connection. The circuit shown in FIGURE 1 opens the circuit between the common collector connection and the common base connection by means of zener diode 38, since current cannot flow from the common collector connection to the common base connection without exceeding the zener breakdown voltage of diode 38 and it is specified that the allowable back voltage did not cause the voltage across diode 38 to exceed its zener diode breakdown voltage.

One disadvantage of the circuit shown in FIGURE 1 is that the control voltage generated by circuit 33 must be relatively large since, in addition to forward biasing the base-emitter junction of transistors 31 and 32, it must also overcome the zener voltage of diode 38. The circuit shown in FIGURE 2 overcomes this disadvantage.

Figure 2:
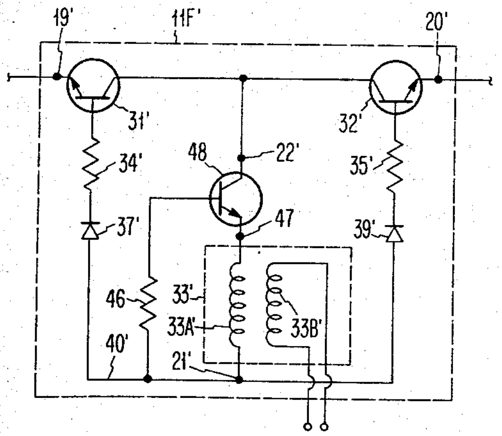
FIGURE 2 shows a second preferred embodiment of the present invention.

The circuit shown in FIGURE 2 is similar to the circuit shown in FIGURE 1 with the exception that zener diode 38 has been replaced by a transistor 48. To show the correspondence between the two circuits, the parts in the circuit shown in FIGURE 2 which correspond to the part shown in the circuit shown in FIGURE 1 have been designated with the same numerals followed by a prime.

In order to turn the switch shown in FIGURE 2 ON, control circuit 33' generates a voltage which is positive with respect to point 21' and negative with respect to point 47. Current therefore flows through resistor 46 and this forward biases the emitter base junction of transistor 48. This turns transistor 48 ON and allows current to flow from the collector of transistor 48 to the emitter of transistor 48. This makes 21' positive with respect to point 22' closing switch 11F, as previously explained. When no voltage is applied by circuit 33', transistor 48 is in a non-conducting state; that is, no current is flowing through the collector of transistor 48 and the switch 11F is in the OFF condition.

The advantage of the circuit shown in FIGURE 2 is that it can be turned ON by relatively small voltage. As previously explained, with the circuit shown in FIGURE 1 in order to turn the circuit ON the voltage generated by circuit 33 had to be sufficient to both forward bias the base-collector junction of transistor 31 and 32 and to overcome the zener voltage of diode 38. With the circuit shown in FIGURE 2, the switch can be turned ON by a voltage pulse which is merely sufficient in magnitude to forward bias transistor 48 so that current flows through the collector of transistor 48 to the emitter thereof. Furthermore, with the circuit shown in FIGURE 1 the maximum amount of back voltage which the switch can sustain in the open condition is the sum of the base-emitter junction of one of the transistors and the zener breakdown voltage of diode 38. If only a relatively small driving voltage is available from the control signal input, a zener diode 38 must be chosen which has a relatively low zener breakdown voltage; hence, a relatively low amount of breakdown voltage can be sustained. With the circuit shown in FIGURE 2 the maximum amount of back voltage which the circuit can sustain is either the sum of the emitter-base breakdown voltage of one of the transistors 31' or 32' and the collector-base breakdown voltage of the other transistors 31 or 32, or it is the sum of the breakdown voltage of one of the emitter-base breakdown voltage of one of the transistors 31' or 32' and the collector-base breakdown voltage of transistor 48. Transistors typically have a relatively large collector-base breakdown voltage; hence, the circuit shown in FIGURE 2 can sustain a relatively large back voltage.

The transistors used in the embodiments described herein are NPN transistors. Naturally it should be understood that the circuit would work equally well with PNP transistors. Since the direction of normal current flow is reversed if PNP transistors are used in place of NPN transistors, the direction of diodes 37 to 39 would be reversed in a circuit which utilized PNP transistors.

The two circuits shown herein untilize transistors in the inverted mode. That is, the control voltage is applied between the base and the collector of the transistors. The present invention is also applicable if the transistors are connected in the normal mode. Such a circuit could be identical to the circuit shown in FIGURE 1 with the exception that the emitter of transistor 31 would be connected to point 41 instead of point 19, and the collector of transistor 31 would be connected to point 19 instead of point 41. The connections of transistor 32 would be similarly reversed.

While the invention has been particularly shown and described with reference to preferred embodiments thereof, it will be understood by those skilled in the art that the foregoing and other changes in the form and details may be made therein without departing from the spirit and scope of the invention.

What is claimed is:

1. A transistor switch comprising:
first and second transistors each having an emitter electrode, a base electrode and a collector electrode;
a common collector connection conecting the collector electrode of said transistors in common;
a common base connection connecting the base electrodes of said transistors in common;
the emitter electrode of said transistors forming a pair of switch terminals; and
a control circuit connected between said common base connection and said common collector connection for opening and closing the path between said switch terminals;
the improvement comprising at least one unidirectional device in said common base connection and means for open-circuiting said control circuit when said switch is in the OFF condition;
whereby said switch can sustain between said switch terminals when said switch is in the open condition a voltage greater than the base emitter breakdown voltage of said transistors.

2. The device recited in claim 1 wherein said means for open-circuiting said control circuit includes a zener diode connected in series with said control circuit.

3. The device recited in claim 1 wherein said control circuit comprises a transistor switch and said means for open-circuiting said control circuit includes means for generating a signal to open said transistor switch.

4. In a transistor switch which includes:
first and second transistors each having an emitter electrode, a base electrode and a collector electrode;
a common collector connection connecting the collector electrode of said transistors in common;
a common base connection connecting the base electrodes of said transistors in common;
the emitter electrode of said transistors forming a pair of switch terminals; and
a control circuit connected between said common base connection and said common collecter connection for opening and closing the path between said switch terminals;
the improvement comprising two unidirectional devices in said common base connection, one connected to the base of each transistor, said control circuit being connected to said common base connection between said unidirectional devices; and
means for open-circuiting said control circuit when said switch is in the OFF condition;
whereby said switch can sustain between said switch terminals when said switch is in the open condition a voltage greater than the base emitter breakdown voltage of said transistors.

5. The device recited in claim 4 wherein said means for open-circuiting said control circuit includes a zener diode connected in series with said control circuit.

6. The device recited in claim 4 wherein said control circuit comprises a transistor switch and said means for open-circuiting said control circuit includes means for generating a signal to open said transistor switch.

7. A transistor switch including:
a first and second transistors each having an emitter electrode, a base electrode and a collector electrode;
a common collecteor connection connecting the collector electrode of said transistors in common;
a common base connection connecting the base electrodes of said transistors in common;
the emitter electrode of said transistors forming a pair of switch terminals;
a control circuit connected between said common base connection and said common collector connection for opening and closing the path between said switch terminals;
at least one unidirectional device in said common base connection; and means for open-circuiting said control circuit when said switch is in the OFF condition;
whereby said switch can sustain between said switch terminals when said switch is in the open condition a voltage greater than the base emitter breakdown voltage of one of said transistors.

8. In a transistor switch which includes:
a first and a second transistor each having a first electrode, a second electrode and a third electrode;
a first connection connecting the third electrodes of said transistors in common;
a second connection connecting the second electrodes of said transistors in common;
the first electrodes of said transistors forming a pair of switch terminals; and
a control circuit connected between said second connection and said first connection for opening and closing the path between said switch terminals;
the improvement comprising two unidirectional devices in said second connection, one connected to the second electrode of each transistor, said control circuit being connected to said second connection between said unidirectional devices; and
means for open-circuiting said control circuit when said switch is in the OFF condition;
whereby said switch can sustain between said switch terminals when said switch is in the open condition a voltage greater than breakdown voltage between the first and second electrodes of said transistors.

9. A transistor switch comprising:
first and second transistors each having a first electrode, a second electrode and a third electrode;
a first connection connecting the third electrode of said transistors in common;
a second connection connecting the second electrodes of said transistors in common;
the first electrodes of said transistors forming a pair of switch terminals; and
a control circuit connected between said second connection and said first connection for opening and closing the path between said switch terminals;
the improvement comprising at least one unidirectional device in said second connection and means for open-circuiting said control circuit when said switch is in the OFF condition;
whereby said switch can sustain between said switch terminals when said switch is in the open condition a voltage greater than the breakdown voltage between the first and second electrodes of said transistors.

References Cited by the Examiner

UNITED STATES PATENTS 3,003,122 10/1961 Gerhard ---------- 329—101 X
3,202,904 8/1965 Madland ---------- 307—88.5 X

References Cited by the Applicant

UNITED STATES PATENTS 2,891,171 6/1959 Schockley.
2,962,603 11/1960 Bright.
3,003,122 10/1961 Gerhard.

OTHER REFERENCES

"Junction Transistors as Switches," R. L. Bright paper 55–156, Transaction of the AIEE, March 1955.

"Small Signal Analysis of Floating Junction Transistor Switch," N. W. Bell, IRE Transactions—Electron Devices, October 1955.

ARTHUR GAUSS, *Primary Examiner.*

D. D. FORRER, *Assistant Examiner.*